United States Patent
Evans et al.

(10) Patent No.: US 6,509,260 B1
(45) Date of Patent: Jan. 21, 2003

(54) METHOD OF SHALLOW TRENCH ISOLATION USING A SINGLE MASK

(75) Inventors: David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/906,899

(22) Filed: Jul. 16, 2001

(51) Int. Cl.$^7$ .......................................... H01L 21/4763
(52) U.S. Cl. ........................................ 438/631; 257/758
(58) Field of Search ................ 438/637, 692, 438/693, 697, 699–701, 759, 631–636, 624, 626; 216/38, 88; 257/752, 758, 760

(56) References Cited

U.S. PATENT DOCUMENTS

| | | | |
|---|---|---|---|
| 3,715,842 A | * | 2/1973 | Tredinnick et al. |
| 5,494,857 A | * | 2/1996 | Cooperman et al. ......... 437/228 |
| 6,069,069 A | * | 5/2000 | Chooi et al. ................. 438/634 |
| 6,090,714 A | * | 7/2000 | Jang et al. ................... 438/692 |
| 6,261,957 B1 | * | 7/2001 | Jang et al. ................... 438/692 |
| 6,365,523 B1 | * | 4/2002 | Jang et al. ................... 438/692 |
| 6,384,482 B1 | * | 5/2002 | Yang et al. .................. 257/758 |

* cited by examiner

*Primary Examiner*—David Nelms
*Assistant Examiner*—David Vu
(74) *Attorney, Agent, or Firm*—David C. Ripma; Matthew D. Rabdau; Scott C. Krieger

(57) ABSTRACT

A method of shallow trench isolation includes preparing a substrate, including forming mesa structures thereon; forming a barrier cap on the mesa structures; forming an oxide multi-layer structure over the mesas and barrier caps, including: depositing a first oxide layer having a conventional polishing rate; depositing a second oxide layer having a low polishing rate; and depositing a third oxide layer having a conventional polishing rate, and polishing the structure to the level of the barrier cap.

23 Claims, 2 Drawing Sheets

METHOD OF SHALLOW TRENCH ISOLATION USING A SINGLE MASK

FIELD OF THE INVENTION

This invention relates to integrated circuit fabrication, and specifically to a method of shallow trench isolation (STI) using a single masking step.

BACKGROUND OF THE INVENTION

Conventional STI, using dummy structures and/or reverse masking, is known to those of ordinary skill in the art. Each technique requires multiple steps and multiple masks during the fabrication process. The multiple steps and masks increase the cost of integrated circuits fabricated using conventional STI. Because of potential mask misalignment, integrated circuit reliability may suffer.

It is desirable to provide a method of STI which does not require multiple masking steps, nor which requires dummy structures.

SUMMARY OF THE INVENTION

A method of shallow trench isolation includes preparing a substrate, including forming mesa structures thereon; forming a barrier cap on the mesa structures; forming an oxide multi-layer structure over the mesas and barrier caps, including: depositing a first oxide layer having a conventional polishing rate, depositing a second oxide layer having a low polishing rate; and depositing a third oxide layer having a conventional polishing rate; and polishing the structure to the level of the barrier cap.

An object of the invention is to provide a method of eliminating extra masking steps for fabrication of devices using STI.

Another object of the invention is to provide a method of STI which does not require dummy structures.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

Figure 1:
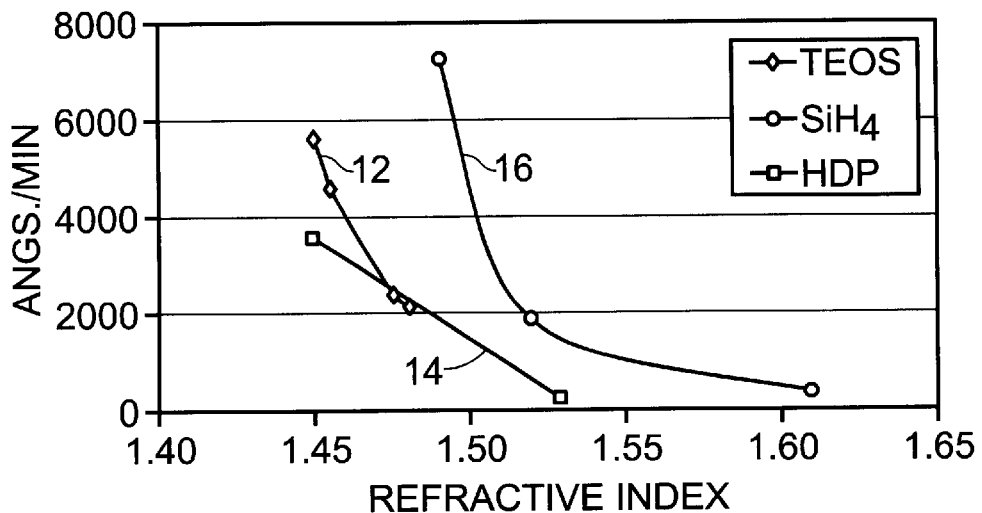
FIG. 1 depicts polish rates for PECVD silicon dioxide.

In the course of investigation of the polishing characteristics of slurries composed of cerium oxide (ceria) and surfactants for which high nitride/oxide polish selectivity may be obtained, we have found that relatively small changes in the properties of silicon dioxide also result in high selectivity polish ratios, as shown in FIG. 1, which depicts various polish rates for three different types of plasma-enhanced chemical vapor deposition (PECVD) silicon dioxide, generally at 10. Trace 12 is for ordinary PECVD tetraethylorthosilicate oxide (TEOS), deposited with various amounts of oxygen. The polish rate drops rapidly as the refractive index increases. Trace 14 is for high-density plasma (HDP) oxide. Again, the polish rate drops with an increasing refractive index. Similar behavior is observed for silane/nitrous oxide chemistry in trace 16, however, the behavior is shifted to higher values of the refractive index. This is probably due to nitrogen incorporation into the film, as nitrogen incorporation shifts the refractive index, but does not appear to shift the removal rate.

Figure 2:
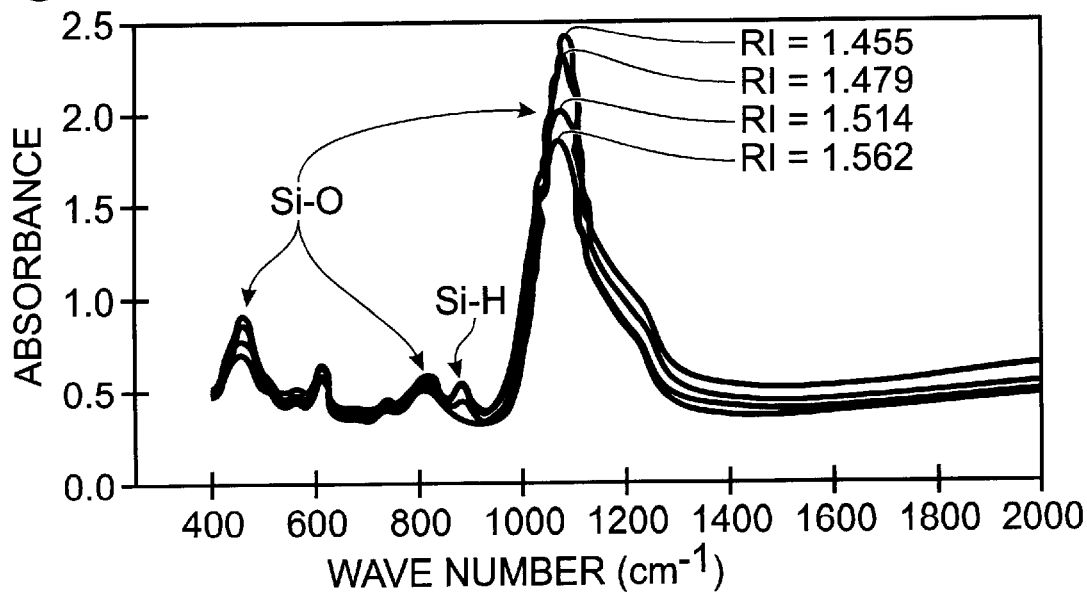
FIG. 2 depicts absorbance v. wave length for various densities of Si—H bonds.

Subsequent investigation related the behavior shown in FIG. 1 to the density of Si—H bonding in the oxide film, as shown in FIG. 2. For these films, a higher Si—H bond density corresponds to a lower CMP removal rate and higher refractive index.

Because the removal rate differential is only observed for ceria abrasive, even in the absence of a surfactant, and because conventional alkali/silica slurry removes all oxide materials at a reasonably high rate, a shallow trench structure may be fabricated with a stopping layer of a "low removal rate" oxide, which is self aligned with device structures.

Figure 3:
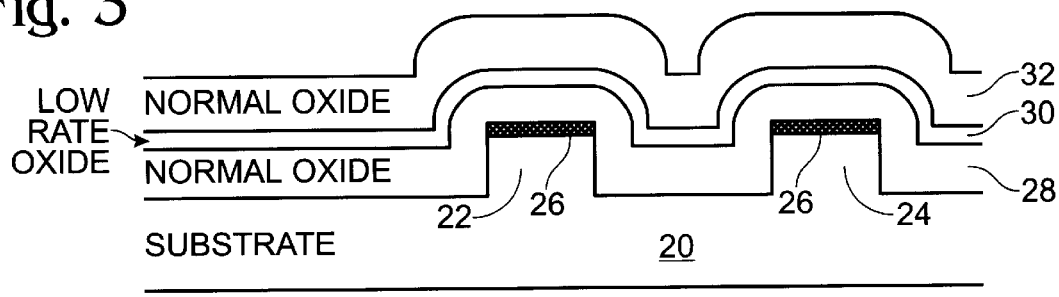
FIG. 3 depicts a sandwich structure of oxides.

The first step in this process is fabrication of a conventional silicon nitride capped STI "mesa" structure, using standard photolithography and plasma etching. Appropriate cleaning, thermal oxidation, ion implantation, etc., processes are carried during the process of preparing a substrate 20, depicted in FIG. 3. Once mesa structures 22, 24 are fabricated, a barrier cap 26, which, in the first embodiment of the method of the invention is a silicon nitride capping layer, is deposited and photoresist is used to mask the structure prior to etching of mesa structures 22, 24. The mesa structures and their barrier caps are covered by the deposition of a "sandwich" structure of conventional oxide layer 28, also referred to herein as a first oxide layer, a low rate oxide layer 30, also referred to herein as a second oxide layer, and another conventional oxide layer 32, also referred to herein as a third oxide layer. The sandwich structure is characterized by multiple layers of oxide having differential polishing rates. The interface between the low rate oxide layer and the upper, normal oxide layer should be as coincident as possible with the top level of the STI mesas. The thickness of the low rate layer is determined by the required process margin. The first and third oxide layers have a polishing rate of between about 50 nm/min and 500 nm/min, while the low rate, second oxide, layer has a polishing rate of between about 10 nm/min and 50 nm/min.

Figure 4:
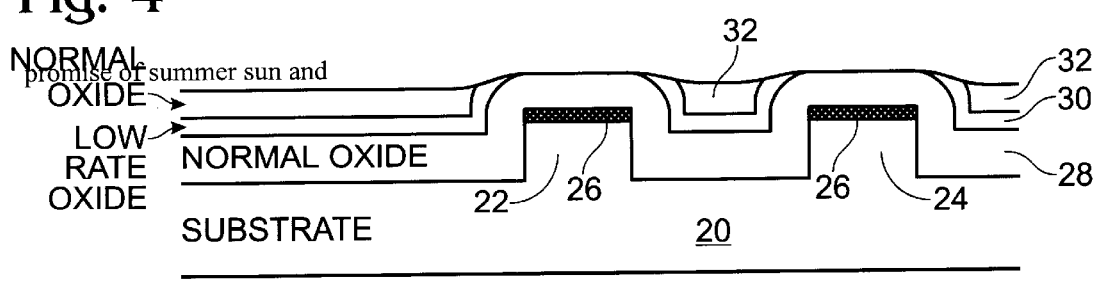
FIGS. 4 and 5 depict successive steps in the fabrication of an integrated circuit device according to the method of the invention.

The next step is the removal of the "overburden" oxide using conventional non-selective, i.e., alkali-silica slurry, providing the structure shown in FIG. 4. This non-selective polish step should be sufficient to remove the low rate oxide layer over device active areas. In addition, substantial planarization will also be achieved. The low rate oxide layer will not be removed completely in the field area. Within this context, it is not a requirement that normal oxide remains in the field. The only real requirement is that a sufficient amount of low rate oxide is left, i.e., it may be acceptable for the non-selective polish step to remove some of the low rate oxide layer.

Figure 5:
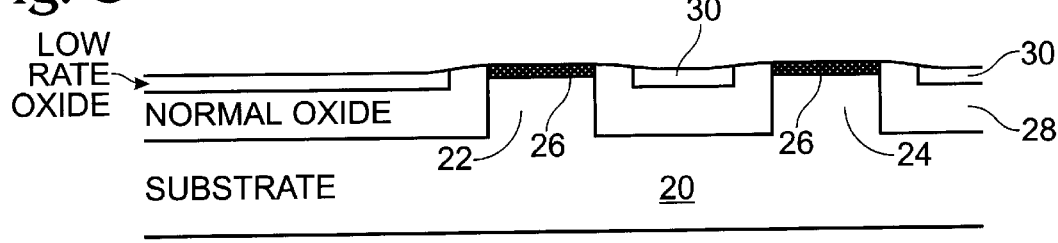

The STI structure is completed, as shown in FIG. 5, by polishing using high selectivity slurry (ceria). In this case, the underlying normal oxide is removed in the device region, but is protected by the low rate oxide remaining in the field. Conventional hot phosphoric acid reflux may be used to remove nitride capping layer 26, while only removing a very thin layer of the field oxide.

Alternatively, polysilicon may be used as the capping layer instead of nitride. The ceria slurry also removes oxide selectively while leaving polysilicon relatively untouched. In this case, the polysilicon layer may be incorporated into the completed device structure.

The method of the invention is well suited for fabrication of VLSI CMOS ICs in the 0.18 μm range and more advanced device technologies. In addition, the method of the invention may be used to fabricate other advanced device structures such as SiGe MOSFET's, FRAM's, etc. For judiciously chosen design rules, dummy structures need not be included in the circuit layout.

Thus, a method of shallow trench isolation using a single mask has been disclosed. It will be appreciated that further variations and modifications thereof may be made within the scope of the invention as defined in the appended claims.

We claim:

1. A method of shallow trench isolation comprising:
    preparing a substrate, including forming mesa structures thereon;
    forming a barrier cap on the mesa structures;
    forming a multi-layer structure over the mesas and barrier caps, wherein the layers in the multi-layer structure have different polishing rates, including depositing a first oxide layer having a high polishing rate; depositing a second oxide layer having a low polishing rate; and depositing a third oxide layer having a high polishing rate; and
    polishing the structure to the level of the barrier cap.

2. The method of claim 1 wherein said polishing includes:
    polishing the structure with a non-selective polish to remove the third oxide layer and portions of the second oxide layer; and
    polishing the structure with a selective polish to remove portions of the second oxide layer and first oxide layer.

3. The method of claim 2 wherein said polishing the structure with a non-selective polish includes polishing the structure with an alkali-silica slurry.

4. The method of claim 2 wherein said polishing the structure with a selective polish includes polishing the structure with a cerium oxide slurry.

5. The method of claim 1 wherein said depositing a first oxide layer having a high polishing rate includes depositing an oxide having a polish rate of between 50 nm/min to 500 nm/min.

6. The method of claim 1 wherein said depositing a second oxide layer having a low polishing rate includes depositing an oxide having a polish rate of between 10 nm/min to 50 nm/min.

7. The method of claim 1 wherein said depositing a third oxide layer having a high polishing rate includes depositing an oxide having a polish rate of between 50 nm/min to 500 nm/min.

8. The method of claim 1 wherein said forming a barrier cap on the mesa structures includes forming a layer of silicon nitride on the mesa structures.

9. The method of claim 8 which further includes removing the silicon nitride barrier cap.

10. The method of claim 1 wherein said forming a barrier cap on the mesa structures includes forming a layer of polysilicon on the mesa structures.

11. A method of shallow trench isolation comprising:
    preparing a substrate, including forming mesa structures thereon;
    forming a barrier cap on the mesa structures;
    forming an oxide multi-layer structure over the mesas and barrier caps, including:
        depositing a first oxide layer having a high polishing rate;
        depositing a second oxide layer having a low polishing rate; and
        depositing a third oxide layer having a high polishing rate; and
    polishing the structure to the level of the barrier cap.

12. The method of claim 11 wherein said polishing includes:
    polishing the structure with a non-selective polish to remove the third oxide layer and portions of the second oxide layer; and
    polishing the structure with a selective polish to remove portions of the second oxide layer and first oxide layer.

13. The method of claim 12 wherein said polishing the structure with a non-selective polish includes polishing the structure with an alkali-silica slurry.

14. The method of claim 12 wherein said polishing the structure with a selective polish includes polishing the structure with a cerium oxide slurry.

15. The method of claim 12 wherein said polishing the structure with a selective polish includes polishing the structure with a cerium oxide slurry.

16. The method of claim 11 wherein said depositing a first oxide layer having a high polishing rate includes depositing an oxide having a polish rate of between 50 nm/min to 500 nm/min.

17. The method of claim 12 wherein said depositing a second oxide layer having a low polishing rate includes depositing an oxide having a polish rate of between 10 nm/min to 50 nm/min.

18. The method of claim 12 wherein said depositing a third oxide layer having a high polishing rate includes depositing an oxide having a polish rate of between 50 nm/min to 500 nm/min.

19. The method of claim 11 wherein said forming a barrier cap on the mesa structures includes forming a layer of silicon nitride on the mesa structures.

20. The method of claim 19 which further includes removing the silicon nitride barrier cap.

21. The method of claim 11 wherein said forming a barrier cap on the mesa structures includes forming a layer of polysilicon on the mesa structures.

22. A method of shallow trench isolation comprising:
    preparing a substrate, including forming mesa structures thereon;
    forming a barrier cap on the mesa structures from a barrier material taken from the group of barrier materials consisting of silicon nitride and polysilicon;
    forming an oxide multi-layer structure over the mesas and barrier caps, including:
        depositing a first oxide layer having a polishing rate of between 50 nm/min to 500 nm/min;
        depositing a second oxide layer having a polishing rate of between 10 nm/min to 50 nm/min; and
        depositing a third oxide layer having a polishing rate of between 50 nm/min to 500 nm/min; and
    polishing the structure to the level of the barrier cap; including:
        polishing the structure with a non-selective polish to remove the third oxide layer and portions of the second oxide layer; and
        polishing the structure with a selective polish to remove portions of the second oxide layer and first oxide layer.

23. The method of claim 22 wherein said polishing the structure with a non-selective polish includes polishing the structure with an alkali-silica slurry.

* * * * *